United States Patent [19]

Trüper et al.

[11] Patent Number: 4,553,040
[45] Date of Patent: Nov. 12, 1985

[54] INDUCTIVE PROXIMITY SWITCH

[76] Inventors: Dirk Trüper, Würthstr. 6, 6800 Heidelberg; Klaus Hermle, Römerstrasse 11, 7303 Neuhausen/Fildern, both of Fed. Rep. of Germany

[21] Appl. No.: 511,738

[22] Filed: Jul. 6, 1983

[30] Foreign Application Priority Data

Jul. 6, 1982 [DE] Fed. Rep. of Germany ....... 3225193

[51] Int. Cl.[4] ............................................. H01H 35/00
[52] U.S. Cl. .................................... 307/116; 340/551; 361/180; 336/96
[58] Field of Search ................. 307/116, 309; 340/551, 340/561; 361/179, 180; 331/65; 246/249; 336/30, 90, 66

[56] References Cited

U.S. PATENT DOCUMENTS

| | | | |
|---|---|---|---|
| 2,983,852 | 5/1961 | Gray | 361/180 |
| 3,469,204 | 9/1969 | Maggar et al. | 340/551 X |
| 3,601,620 | 8/1971 | Gee | 307/116 |
| 3,601,691 | 8/1971 | Gardiner | 331/65 X |
| 3,732,503 | 5/1973 | Rapp et al. | 361/180 X |
| 3,743,853 | 7/1973 | Dittman et al. | 307/116 |
| 3,747,010 | 7/1973 | Buck | 331/65 |
| 3,764,819 | 10/1973 | Muller | 340/551 X |
| 3,872,398 | 3/1975 | Fausone et al. | 331/65 |
| 4,323,847 | 4/1982 | Karbowski | 331/65 X |
| 4,419,646 | 12/1983 | Hermle | 307/116 X |

Primary Examiner—A. D. Pellinen
Assistant Examiner—Derek S. Jennings
Attorney, Agent, or Firm—Leydig, Voit & Mayer, Ltd.

[57] ABSTRACT

The invention relates to an inductive proximity switch having a feeler head with a feeler coil as a component of an LC oscillator circuit of a high frequency oscillator, the feeler head serving to generate a directionally oriented, alternating magnetic field, whereby the feeler coil of the feeler head is coupled with a closed circuit loop comprising an inductance and an ohmic resistance such that the oscillator is damped when the field is undisturbed and its damping is reduced when the field is disturbed by a nonmagnetic object such that an oscillation occurs.

10 Claims, 4 Drawing Figures

INDUCTIVE PROXIMITY SWITCH

BACKGROUND OF THE INVENITON

The invention relates to an inductive proximity switch comprising a feeler head with a feeler coil as a component of an LC oscillator circuit of a high frequency oscillator, the feeler head serving to generate a directionally oriented, alternating magnetic field.

Inductive proximity switches of this type are known in numerous variations, for example from DE-AS No. 24 61 169.

The known inductive proximity switches are nearly all designed such that, with their aid, only the approach of a ferromagnetic metal object can be well detected. It has, however, been shown that it would, in many cases, be desirable to have the possibility of also detecting nonmagnetic metal objects, for example objects made from aluminum, copper, brass and the like.

SUMMARY OF THE INVENTION

Proceeding on the basis of the prior art the object underlying the invention is to design an inductive proximity switch of the type described at the beginning such that it also enables nonmagnetic metal objects, i.e. paramagnetic and diamagnetic metallic objects, to be detected.

According to the invention this object is solved for an inductive proximity switch of the type described at the beginning in that the feeler coil of the feeler head is coupled with a closed circuit loop comprising an inductance and an ohmic resistance such that the oscillator is damped when the field is undistrubed and damping of the oscillator is reduced when the field is disturbed by a nonmagnetic metal object such that an oscillation occurs.

The decisive advantage of the inventive proximity switch is that it can be used without any special preparations being necessary in cases where the previous proximity switches, which only respond well to ferromagnetic materials, cannot be used.

In the case of the inventive proximity switch it is advantageous for the resistance of the series resistor to be selected relative to the additional inductance such that the coupling between the additional inductance and the feeler coil, which is present when the field is undisturbed, results in a power matching which leads to a maximum damping of the high frequency oscillator due to the additional series circuit comprising an inductance and a resistance and therefore to a maximum power loss. On the other hand, with this design even a relatively slight disturbance of the field and a correspondingly slight change in the coupling will lead to a marked reduction in damping of the oscillator or the oscillator circuit so that an approaching metal object can be reliably detected in that the sensed damping is converted into corresponding control signals.

In development of the invention it is also possible to realise the additional transformer circuit of inductance and ohmic resistance by way of a simple metal ring, which, as a coil with a single winding, operates with a corresponding resistivity. In this respect, magnetizable metal rings are particularly preferred since the ohmic losses in such magnetizable metal rings are unmistakeably greater than the ohmic losses in a diamagnetic or paramagnetic material.

When putting an inductive proximity switch according to the invention into actual practice it has proven to be particularly advantageous for the feeler coil to be disposed in the usual way within a cup core so that the resulting field has a marked orientation characteristic while the additional inductance is disposed as a coil at the front end of the cup core and concentrically to its outer wall. It is then favourable for a small annular slot to remain between the outer wall of the cup core and the additional coil.

In further development of the invention it has proven favourable to provide corresponding control means, with the aid of which the series circuit comprising inductance and ohmic resistance can be opened and thereby made inactive so that the inventive proximity switch can be used as a normal, inductive proximity switch for detecting magnetizable metal objects. It should, however, be noted that, in this type of operation, the control signals occurring at the output of the proximity switch have the opposite significance to those occurring during detection of nonmagnetic metal objects since the damping of the oscillator circuit will be reduced by nonmagnetic materials but increased by magnetizable materials.

BRIEF DESCRIPTION OF THE DRAWINGS

Additional details and advantages of the invention are explained in more detail on the basis of drawings and/or are the subject matter of subclaims. The drawings show:

DESCRIPTION OF THE PREFERRED EMBODIMENTS

Figure 1:
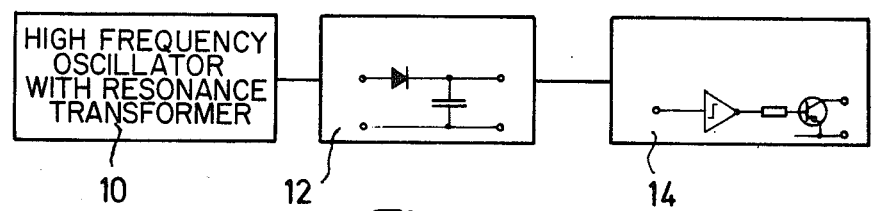
FIG. 1 a block diagram of an inventive proximity switch with the associated evaluating means.

FIG. 1 shows in detail a block diagram showing a high frequency oscillator with resonance transformer—block 10—which forms the actual proximity switch and the output side of which is connected to a demodulator 12 comprising, in principle, a rectifier and a smoothing capacitor, as indicated in the drawing. A Schmitt trigger stage with circuit amplifier—block 14—is connected with the output side of the demodulator 12.

Figure 2:
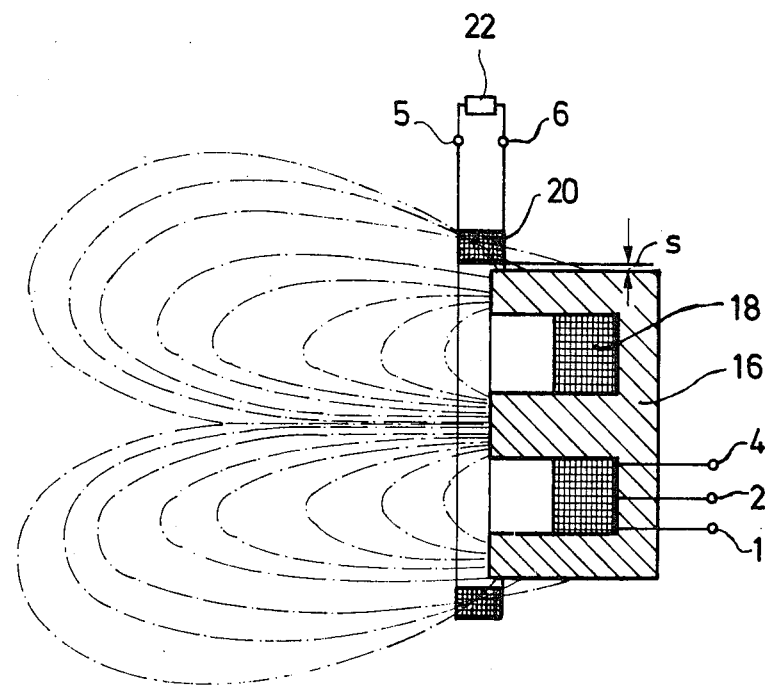
FIG. 2 a schematic cross section through the feeler head of an inventive proximity switch.

Of the three blocks forming the complete proximity switch according to FIG. 1 block 10 is of particular interest within the scope of the present application and, within block 10, the design of the transformer arrangement for the feeler head of the proximity switch. The relevant elements are illustrated in FIG. 2. FIG. 2 shows in detail a cup core 16, in which a feeler coil 18 is located in the customary fashion; this feeler coil has three connections 1, 2 and 4, connections 1 and 4 being associated with the ends of the feeler coil 18 and connection 2 with a tab of the same. An additional coil 20 is provided at the front end of the cup core 16; this coil 20 protrudes at least partially beyond the open front end of the cup core 16 and has two connections 5, 6, via which the ends of the additional core 20 are connected to a resistor 22 so that a closed electric circuit results from the series connection of an inductance and a resistance. In this respect, an annular slot s is provided between the coil 20 and the cup core 16.

FIG. 2 also illustrates the lines of flux of the magnetic field generated by the feeler coil 18. It may be seen that the resulting flow through the additional coil 20 is obtained by lines of flux of the stray field which are concentrated in the proximity of the open end of the cup core 16 at its outer side. The inventive proximity switch or rather the special arrangement according to FIG. 2 utilizes the fact that it is the lines of flux leading to the resulting magnetic flow through the additional coil 20, which are particularly strongly influenced by a non-magnetic material entering the magnetic field, namely in the sense of reducing the magnetic flow through the additional coil 20 and thereby leading to a drastic reduction in the coupling between the feeler coil 18 and the coil 20.

Figure 3:
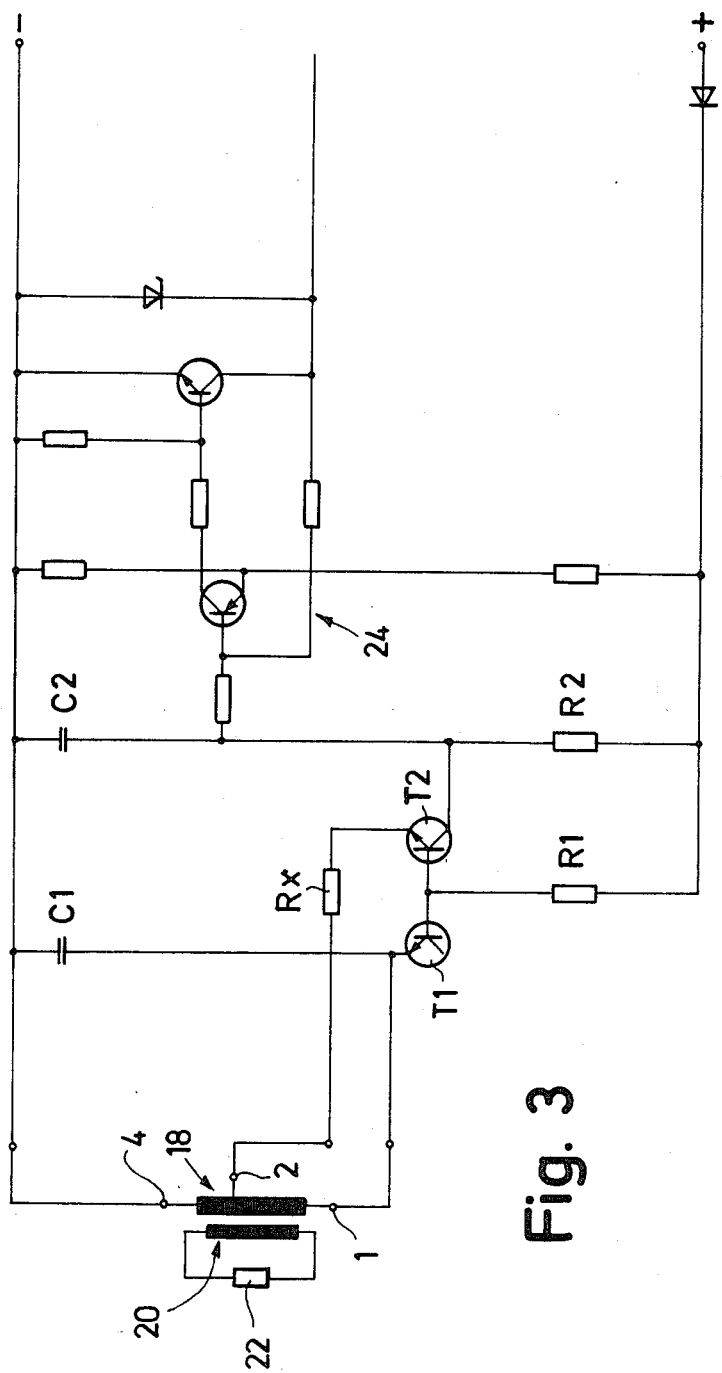
FIG. 3 a circuit diagram of an inventive proximity switch.

The arrangement described above according to FIG. 2 is supplemented for the complete proximity switch, as clearly shown in FIG. 3, by a capacitor C 1 between the outer connections 1 and 4 of the feeler coil 18 to form a resonance transformer, the following equation applying for its transformation ratio (t):

$$t = (L_2/M)^2$$

whereby
$L_2$ = inductance of the coil 20 and
$M$ = mutual inductance.
In this respect the following equation applies for the mutual inductance M:

$$M = (\phi/I_1) \times N_2$$

whereby
$I_1$ = current in feeler coil 18,
$N_2$ = number of windings of coil 20 and
$\phi$ = resulting magnetic flux through coil 20.

As shown in the circuit diagram according to FIG. 3 the feeler coil 18 forms an electric oscillator circuit together with a capacitor C 1 and an amplifier element with two transistors T 1, T 2, three resistors R x, R 1, R 2 and a capacitor C 2. This oscillator circuit oscillates in an undamped state, for example at a frequency of between 500 and 600 kHz whereby the transistor T 1 uses only the base-emitter circuit as a diode in order to be matched particularly well to the electrical properties of the base-emitter circuit of the transistor T 2 connected as a transistor.

If, in this oscillator circuit, the current in the coil 18 is just flowing from connection 1 to connection 4 the transistor T 1 functioning as a diode is then rendered non-conductive so that the flow of current through the coil 18 results in a corresponding charging of capacitor C 1. In addition, the transistor T 2 can be switched into the conductive state via the resistor R 1 so that a current can flow between the positive supply voltage connection (+) and the negative supply voltage connection (−) of the circuit loop via the resistor R 2, the transistor T 2, the resistor R x and the coil portion located between the tab 2 and the connection 4 of coil 18. The feeler coil 18 functions as an autotransformer, the low-voltage winding being located between the tab 2 and the upper coil connection 4 shown in FIG. 3. Since, in the case of a transformer, the currents and voltages on the primary and secondary sides are shifted through 180° relative to each other the current flowing between connections 1 and 2 must, according to the requirements specified above—flow of current from 1 to 4—, be directed from connection 2 towards connection 1.

When the capacitor C 1 is sufficiently charged according to the specified operational conditions the direction of the current will be reversed. Capacitor C 1 will therefore discharge via the high-voltage winding of coil 18 whereas no more current can flow through the low-voltage winding of this coil since the emitter-base circuit of transistor T 2 is rendered non-conductive in this direction. When the charge of capacitor C 1 is completely reversed current will again flow from connection 1 to connection 4 and, in the low-voltage winding, from connection 2 to connection 4. During this half wave of the oscillation the transistor T 2 again functions as an amplifier in order to supply the necessary energy to the oscillator circuit. The amplitude of the impulse is then limited by the resistor R x.

When the oscillator circuit oscillates and the transistor T 2 is rendered conductive, the resistor R 2, the transistor T 2 and the resistor R x as well as the section of the feeler coil 18 located between the connections 2 and 4 will together form a voltage divider. If the positive supply voltage connection is considered as a reference potential, a relatively high negative voltage will result in this half wave of the oscillation at the collector for transistor T 2 since the resistor R 2 is highly resistive relative to the other elements of the voltage divider. The capacitor C 2 between the collector for transistor T 2 and the negative supply voltage connection is virtually short-circuited and hardly able to recharge. When the transistor T 2 is then rendered non-conductive during the next half wave the capacitor C 2 will begin to recharge via resistor R 2, only a slight recharging being, however, achieved due to the high frequency and dimensions of the elements in this RC network. The capacitor C 2 therefore serves in the long run to stabilize the input voltage for a trigger circuit 24, which may be constructed in the customary way and the elements of which are illustrated in FIG. 3 but not designated in detail and will not be explained further. It should suffice to point out that the transistors of the trigger circuit 24 become conductive when the above-mentioned oscillator circuit oscillates and a correspondingly high direct voltage with negligible residual ripple is present at the collector of transistor T 2.

The circuit according to FIG. 3 substantially corresponds, insofar as it has been described so far, to the circuit of a customary proximity switch. In the case of an inventive proximity switch, however, the electric oscillator circuit can oscillate only when the coupling between the coils 18 and 20 is reduced relative to the normal coupling by a nonmagnetic metallic object entering the magnetic field of the feeler coil. If this is not the case then damping of the oscillator circuit will be so great, due to losses in the coupled transformer circuit 20, 22, that the oscillator circuit cannot oscillate; the trigger circuit 24 will then remain in a state corresponding to the damped state of the oscillator circuit.

Figure 4:
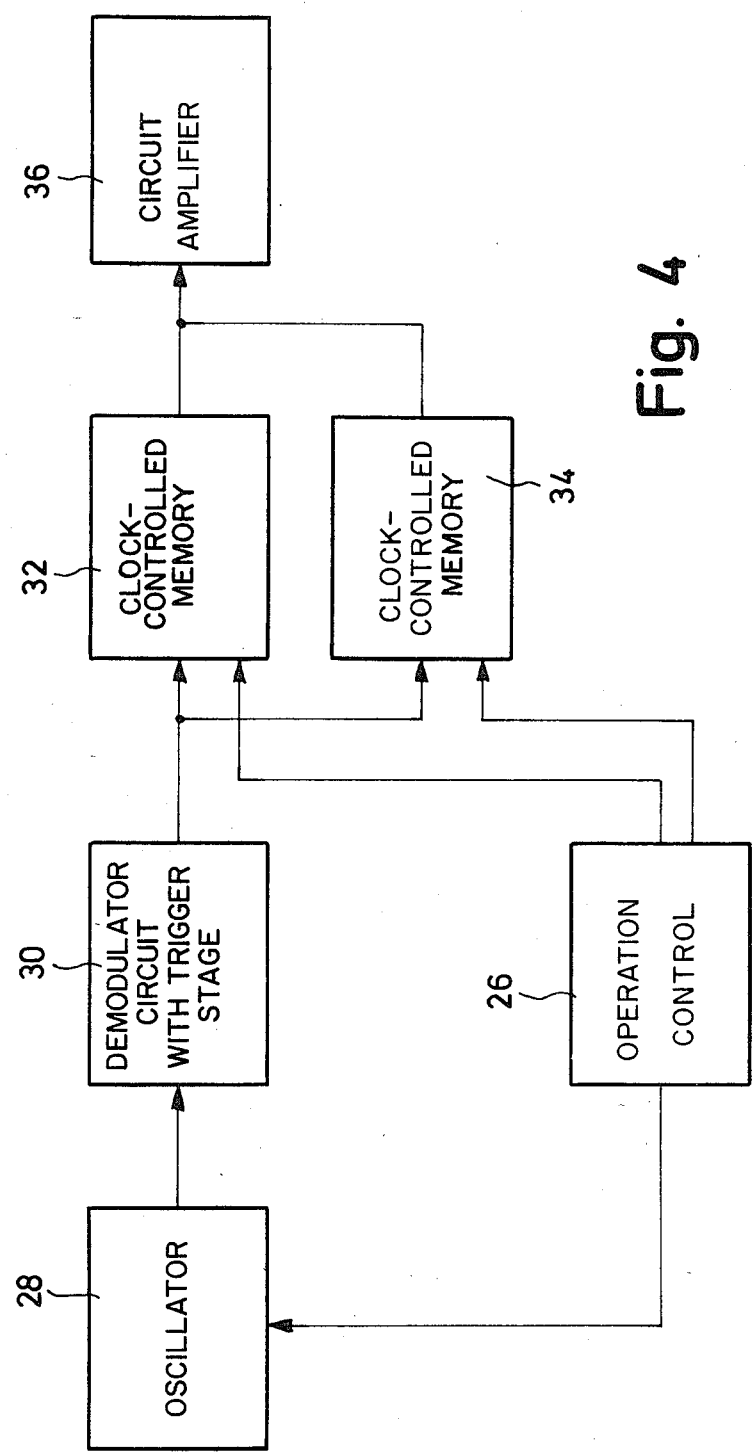
FIG. 4 control means for switching over an inventive proximity switch from detecting nonmagnetic metal objects to detecting magnetizable metal objects.

Since an inventive, inductive proximity switch comprises all the elements of a conventional, inductive proximity switch, supplemented however by a series circuit comprising the additional coil 20 and the resistor 22 forming a closed circuit, it is also possible in development of the invention to obtain, by opening the closed circuit, a conventional inductive proximity switch which responds to ferromagnetic objects entering its magnetic field. FIG. 4 shows a corresponding control circuit, with the aid of which it is possible to switch over the proximity switch, during operation, from detecting nonmagnetic metal objects to detecting magnetizable metal objects. For this purpose, an operation control 26 is provided, the output of which is connected to the oscillator 28 and with the aid of which the connection between the coil 20 and a connection of the resistor 22 may be periodically opened. When the circuit loop comprising coil 20 and resistor 22 is closed the oscillator 28 functions as described above. If this circuit loop is, however, opened the oscillator 28 will then fucntion as in the case of a customary inductive proximity switch for ferromagnetic elements. The oscillator therefore oscillates when the field is undistrubed and will be increasingly damped when a ferromagnetic object enters the magnetic field until the oscillation ceases when a predetermined minimum distance is reached. In this respect, the predetermined minimum distance can, for example for iron and aluminum objects, be made the same by switching over the resistivity of the emitter resistor R x at the same time as the closed circuit 20, 22 is opened.

The output signals from the oscillator 28 are applied to a demodulator circuit with trigger stage—block 30—, the output from which is connected to an input to each of two clock-controlled memories 32, 34. The second inputs to each of these memories 32, 34 are each connected to a further output from the operation control 26. The outputs from memories 32, 34 are both joined to a circuit amplifier 36. The operation control 26 controls the memories 32, 34 such that memory 34 is switched in for detection of iron (Fe) or general ferromagnetic material in order to accept the output signals from the trigger stage of block 30. Memory 32 is switched in by the operation control 26 when the circuit loop 20, 22 is closed and accepts, during this period of time, the output signals from the trigger stage of the modulator 30. It may therefore be seen from the memories 32, 34 whether a nonmagnetic metal object, in particular of aluminum (Al), or a magnetizable object has entered the magnetic field of the feeler head or whether the magnetic field is not disturbed. The corresponding output signals may then be fed to the circuit amplifier 36. If the length of the switching periods for the operation control 26 is suitably selected it is possible for an inventive proximity switch, with the arrangement according to FIG. 4, to detect both nonmagnetic metal objects and magnetizable metal objects. Since the relevant information is first of all evaluated separately in the memories 32, 34 it is also possible in development of the invention to evaluate the additional information on the material entering the magnetic field so that the same proximity switch can respond, for example, to an aluminum cam in order to trigger a first switching operation as a function of an output signal from the memory 32 and, in addition, to a steel cam in order to trigger a second switching operation, which differs from the first switching operation, as a function of an output signal from the memory 34. An evaluation therefore takes place not only as to whether or not the field is disturbed but also as to whether this disturbance was caused by a nonmagnetic or a ferromagnetic material whereupon corresponding, varying switching operations will be triggered.

When the additional closed circuit loop for a metal detector according to the invention is not formed by separate structural elements but by a metal ring it is then particularly advantageous to manufacture this metal ring from a metal foil since the desired ohmic resistance may easily be achieved in this case by using a foil which is only a few hundredths of a millimeter thick.

In addition, it should be pointed out that in the case of a metal detector according to the invention it is also, in principle, possible to evaluate directly the voltage induced in the additional circuit loop. This may take place according to the embodiment in FIG. 2, for example, in that the voltage drop over the resistor 22 is measured. In the case of such direct evaluation of the voltage induced in the additional circuit loop it is then, of course, no longer important whether the oscillator is in fact damped or not by the additional circuit loop when the field is undisturbed.

We claim:

1. Inductive proximity switch comprising a feeler head with a feeler coil as a component of an LC oscillator circuit of a high frequency oscillator with said feeler coil being disposed in the interior of a cup core being open at one end thereof, said feeler head serving to generate a directionally oriented, alternating magnetic field, wherein the feeler coil of the feeler head is coupled with a closed circuit loop being disposed at the open end of the cup core and adjacent to its outer wall, said closed circuit loop comprising an inductance and an ohmic resistance such that the oscillator is damped when the field is undisturbed and such that damping of the oscillator is reduced when the field is disturbed by a non-magnetic metal object such that an oscillation occurs.

2. The proximity switch of claim 1, wherein the ohmic resistance is selected such that the coupling present when the field is undisturbed results in a power matching which damps the oscillator.

3. The proximity switch of claim 1, wherein the closed circuit loop is formed by a metal ring.

4. The proximity switch of claim 3, wherein the metal ring consists of a magnetized material.

5. The proximity switch of claim 3, wherein the metal ring consists of a metal foil.

6. The proximity switch of claim 1, wherein the closed circuit loop comprises a resistor and an inductor.

7. The proximity switch of claim 6, wherein the inductance of the closed circuit loop is a coil.

8. The proximity switch of claim 7, wherein said closed circuit loop comprises a normally closed switch which can be selectively opened by control means in order to detect, instead of non-magnetic metal objects, objects made of a magnetizable material.

9. The proximity switch of claim 8, wherein said switch is periodically openable by the control means and wherein separate outputs are provided for evaluation of the output signals obtained from the closed circuit loop and an open circuit loop.

10. The proximity switch of claim 1, wherein evaluating means are provided for evaluating the voltage induced in the closed circuit loop.

* * * * *